United States Patent
Ito et al.

(10) Patent No.: US 10,062,653 B2
(45) Date of Patent: Aug. 28, 2018

(54) SEMICONDUCTOR DEVICE AND METHOD FOR MANUFACTURING SAME

(71) Applicant: Toshiba Memory Corporation, Minato-ku (JP)

(72) Inventors: Takayuki Ito, Yokkaichi (JP); Yasunori Oshima, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/375,670

(22) Filed: Dec. 12, 2016

(65) Prior Publication Data

US 2018/0090450 A1 Mar. 29, 2018

Related U.S. Application Data

(60) Provisional application No. 62/401,215, filed on Sep. 29, 2016.

(51) Int. Cl.

| | |
|---|---|
| *H01L 29/788* | (2006.01) |
| *H01L 29/76* | (2006.01) |
| *H01L 23/00* | (2006.01) |
| *H01L 27/11524* | (2017.01) |
| *H01L 27/11556* | (2017.01) |
| *H01L 27/11548* | (2017.01) |

(Continued)

(52) U.S. Cl.
CPC ........ *H01L 23/562* (2013.01); *H01L 27/1157* (2013.01); *H01L 27/11524* (2013.01); *H01L 27/11548* (2013.01); *H01L 27/11556* (2013.01); *H01L 27/11575* (2013.01); *H01L 27/11582* (2013.01); *H01L 29/161* (2013.01)

(58) Field of Classification Search
None
See application file for complete search history.

(56) References Cited

U.S. PATENT DOCUMENTS

| | | |
|---|---|---|
| 6,617,690 B1 | 9/2003 | Gates et al. |
| 8,198,667 B2 | 6/2012 | Kuniya et al. |

(Continued)

FOREIGN PATENT DOCUMENTS

| | | |
|---|---|---|
| JP | 4045216 | 2/2008 |
| JP | 2009-158775 | 7/2009 |

(Continued)

*Primary Examiner* — Sitaramarao S Yechuri
(74) *Attorney, Agent, or Firm* — Oblon, McClelland, Maier & Neustadt, L.L.P.

(57) ABSTRACT

According to one embodiment, the recess has a side surface and a bottom surface. The side surface is continuous with the major surface. The bottom surface is positioned lower than the major surface. The stacked body is provided above the major surface of the substrate. The stacked body includes a plurality of electrode layers stacked with an insulating body interposed. The columnar portion includes a semiconductor body and a stacked film. The semiconductor body extends in a stacking direction of the stacked body through the stacked body. The semiconductor body contacts the side surface and the bottom surface of the recess of the substrate. The stacked film includes a charge storage portion and is provided between the semiconductor body and the stacked body higher than the major surface of the substrate. The stacked film is not provided in the recess of the substrate.

17 Claims, 18 Drawing Sheets

(51) Int. Cl.
*H01L 27/1157* (2017.01)
*H01L 27/11582* (2017.01)
*H01L 27/11575* (2017.01)
*H01L 29/161* (2006.01)

(56) References Cited

U.S. PATENT DOCUMENTS

| | | | |
|---|---|---|---|
| 8,582,341 | B2 | 11/2013 | Fukuzumi et al. |
| 8,623,728 | B2 | 1/2014 | Chang et al. |
| 9,018,682 | B2 | 4/2015 | Izumida et al. |
| 9,343,358 | B1* | 5/2016 | Xu .................... H01L 21/76877 |
| 9,449,885 | B1* | 9/2016 | Reznicek ........ H01L 21/823821 |
| 2010/0320528 | A1* | 12/2010 | Jeong .................... H01L 27/105 |
| | | | 257/324 |
| 2011/0059595 | A1* | 3/2011 | Jung ................. H01L 29/66833 |
| | | | 438/430 |
| 2013/0065369 | A1* | 3/2013 | Yang ................. H01L 27/11582 |
| | | | 438/268 |
| 2013/0286735 | A1* | 10/2013 | Hwang ............. H01L 27/11551 |
| | | | 365/185.05 |
| 2014/0061574 | A1* | 3/2014 | Pio ........................ H01L 27/10 |
| | | | 257/5 |
| 2016/0071861 | A1* | 3/2016 | Serov ................ H01L 27/11556 |
| | | | 365/185.19 |
| 2016/0315089 | A1 | 10/2016 | Ito et al. |

FOREIGN PATENT DOCUMENTS

| | | |
|---|---|---|
| JP | 2013-65604 | 4/2013 |
| JP | 5465630 | 4/2014 |
| JP | 2014-241358 | 12/2014 |

\* cited by examiner

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/401,215, filed on Sep. 29, 2016; the entire contents of which are incorporated herein by reference.

FIELD

Embodiments described herein relate generally to a semiconductor device and a method for manufacturing a semiconductor device.

BACKGROUND

A three-dimensional memory device that includes multiple electrode layers stacked on a substrate, and a semiconductor body piercing the multiple electrode layers in the stacking direction of the multiple electrode layers to reach the substrate has been proposed. The lowermost electrode layer of the multiple electrode layers most proximal to the substrate induces a channel (an inversion layer) in the front surface of the substrate.

DETAILED DESCRIPTION

Figure 1:
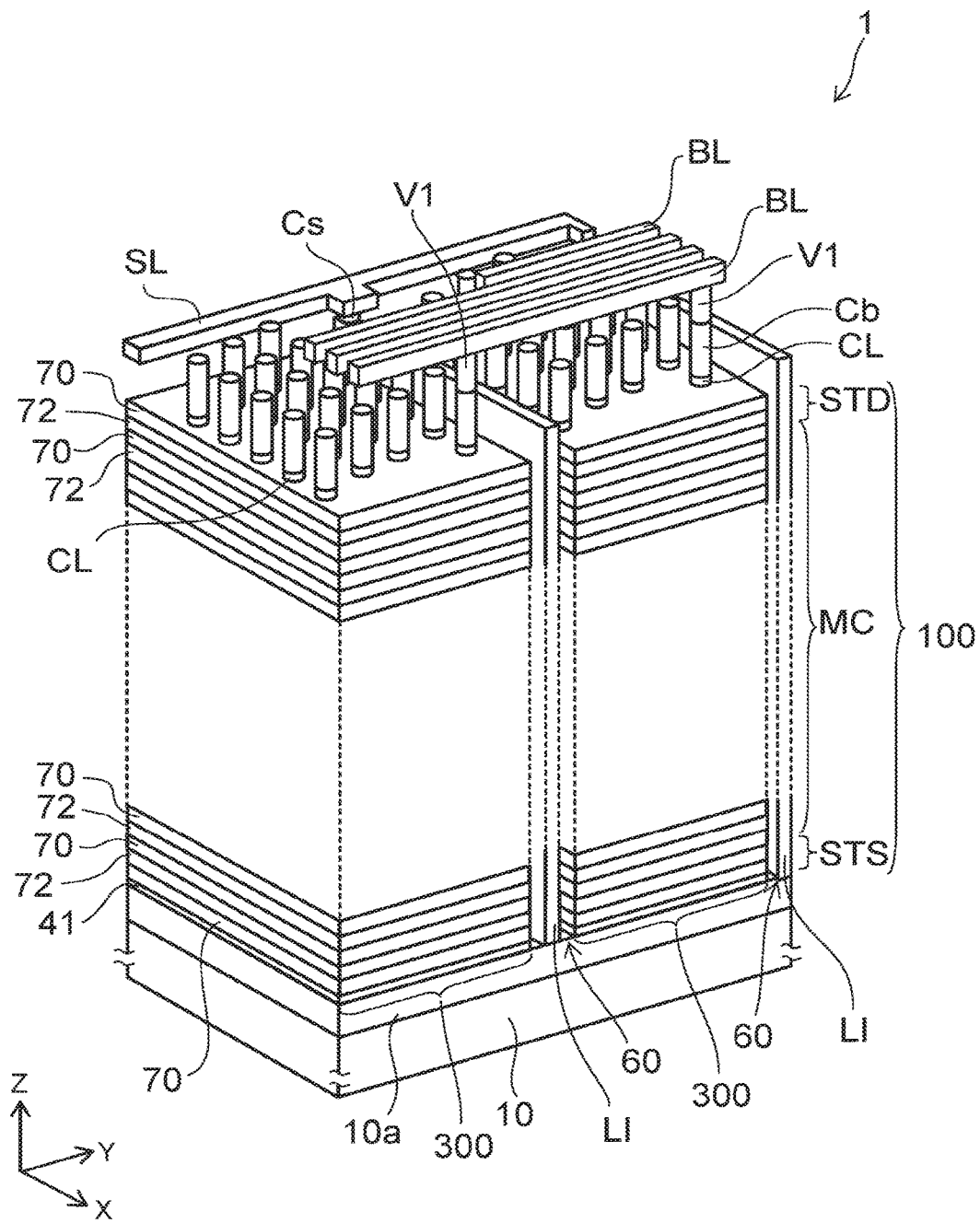
FIG. 1 is a schematic perspective view of a semiconductor device of an embodiment.

According to one embodiment, a semiconductor device includes a substrate, a stacked body, and a columnar portion. The substrate has a major surface and a recess. The recess has a side surface and a bottom surface. The side surface is continuous with the major surface. The bottom surface is positioned lower than the major surface. The stacked body is provided above the major surface of the substrate. The stacked body includes a plurality of electrode layers stacked with an insulating body interposed. The columnar portion includes a semiconductor body and a stacked film. The semiconductor body extends in a stacking direction of the stacked body through the stacked body. The semiconductor body contacts the side surface and the bottom surface of the recess of the substrate. The stacked film includes a charge storage portion and is provided between the semiconductor body and the stacked body higher than the major surface of the substrate. The stacked film is not provided in the recess of the substrate.

Embodiments are described below with reference to the drawings. In the drawings, the same components are denoted by the same reference numerals and signs.

For example, a semiconductor memory device that includes a memory cell array having a three-dimensional structure is described as a semiconductor device in the embodiment.

FIG. 1 is a schematic perspective view of a memory cell array 1 of the embodiment.

Figure 2:
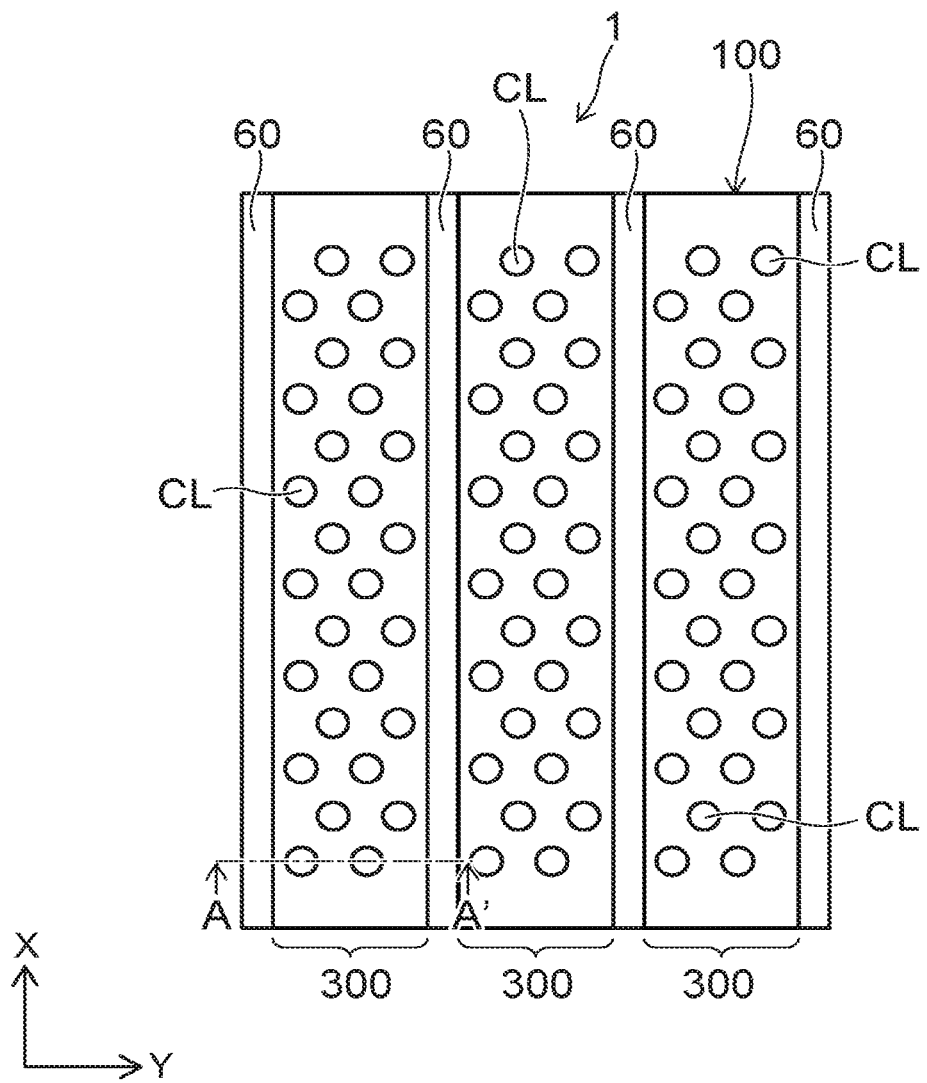
FIG. 2 is a schematic plan view of the semiconductor device of the embodiment.

FIG. 2 is a schematic plan view of the memory cell array 1.

Figure 3:
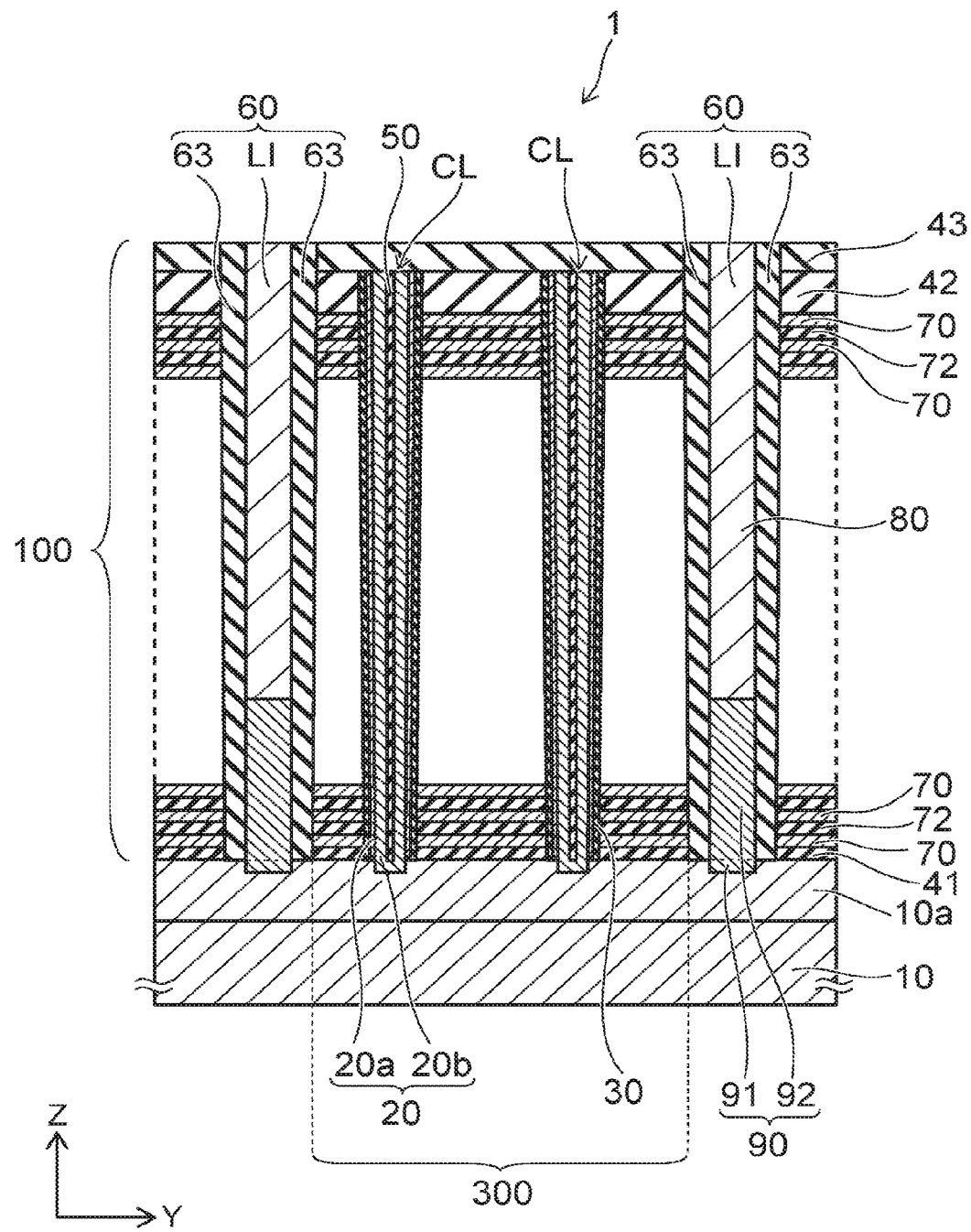
FIG. 3 is an A-A' cross-sectional view of FIG. 2.

FIG. 3 is an A-A' cross-sectional view of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in other drawings correspond respectively to the X-direction, the Y-direction, and the Z-direction of FIG. 1.

The memory cell array 1 includes the substrate 10, a stacked body 100 provided on the substrate 10, multiple columnar portions CL, multiple separation portions 60, and upper layer interconnects provided above the stacked body 100. In FIG. 1, for example, bit lines BL and a source line SL are shown as the upper layer interconnects.

The columnar portions CL are formed in substantially circular columnar configurations extending in the stacking direction of the stacked body 100 (the Z-direction) through the stacked body 100. For example, the multiple columnar portions CL have a staggered arrangement. Or, the multiple columnar portions CL may have a square lattice arrangement along the X-direction and the Y-direction.

As shown in FIG. 2, the separation portions 60 extend in the X-direction and divide the stacked body 100 into multiple blocks (or finger portions) 300 in the Y-direction.

As shown in FIG. 1, the multiple bit lines BL are provided above the stacked body 100. The multiple bit lines BL are, for example, metal films extending in the Y-direction. The multiple bit lines BL are separated from each other in the X-direction.

The upper end portions of semiconductor bodies 20 of the columnar portions CL described below are connected to the bit lines BL via contacts Cb and contacts V1 shown in FIG. 1.

Multiple columnar portions CL are connected to one common bit line BL. The multiple columnar portions CL that are connected to the common bit line BL include one columnar portion CL selected from each block 300 divided in the Y-direction by the separation portions 60.

As shown in FIG. 3, the stacked body 100 includes multiple electrode layers 70 stacked on the substrate 10. The multiple electrode layers 70 are stacked in a direction (the Z-direction) perpendicular to the major surface of the substrate 10 with insulating layers (insulating bodies) 72 interposed. The electrode layers 70 are metal layers. The electrode layers 70 are, for example, tungsten layers including tungsten as a major component, or molybdenum layers including molybdenum as a major component.

The substrate 10 is, for example, a silicon substrate including silicon as a major component; and an active region 10a is provided on the front surface side of the substrate 10. The active region 10a is, for example, a P-type silicon region (a P-type well).

An insulating layer 41 is provided on the front surface of the active region 10a. The lowermost electrode layer 70 is provided on the insulating layer 41. An insulating layer 42 is provided on the uppermost electrode layer 70; and an insulating layer 43 is provided on the insulating layer 42. The insulating layer 43 covers the upper ends of the columnar portions CL.

Figure 4:
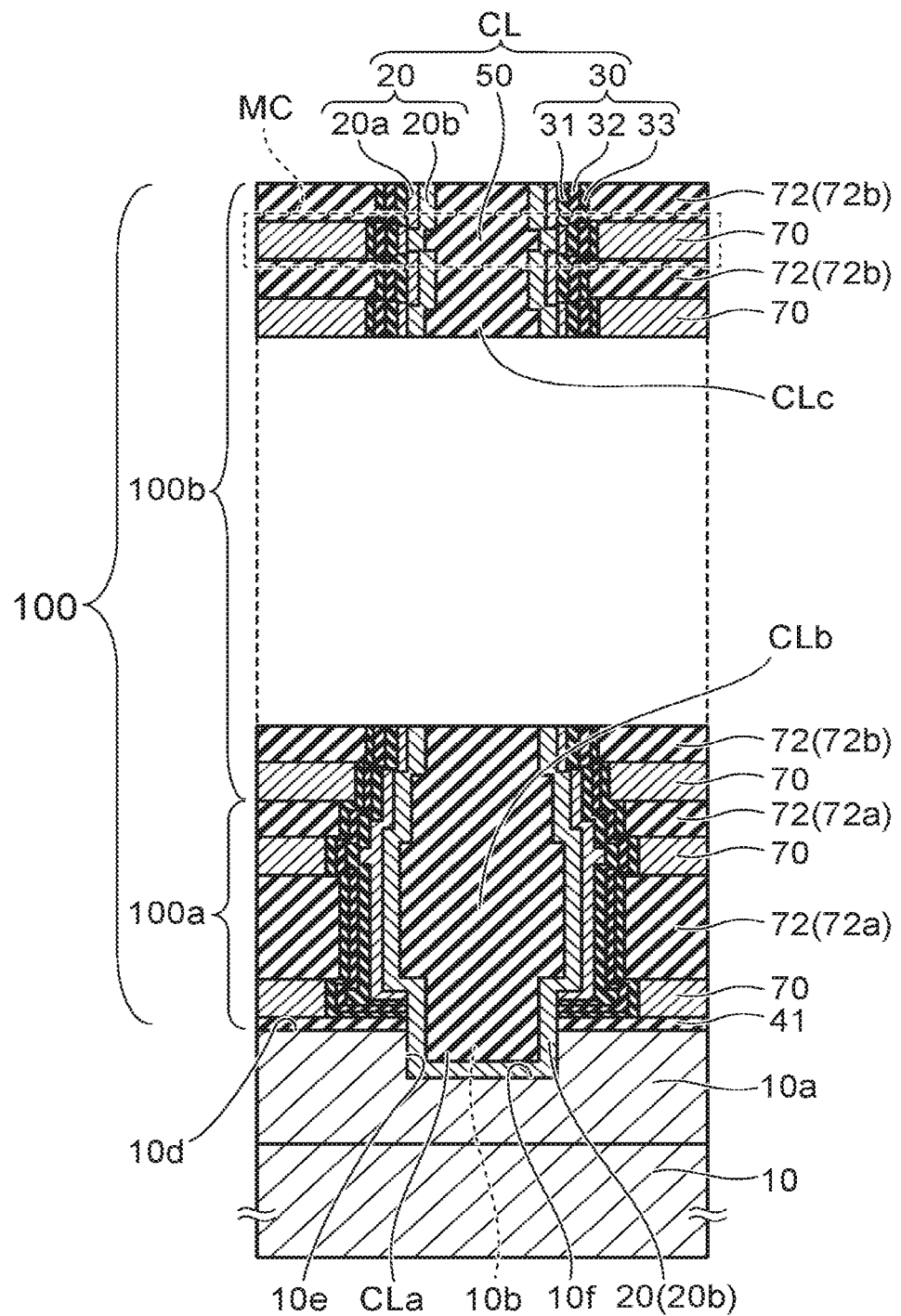
FIG. 4 is a schematic cross-sectional view of the semiconductor device of the embodiment.

FIG. 4 is an enlarged cross-sectional view of a portion of the stacked body 100 where the columnar portion CL is provided.

The columnar portion CL includes a stacked film (a memory film) 30, the semiconductor body 20, and a core film 50 that is insulative.

The semiconductor body 20 extends to be continuous in a cylindrical configuration in the stacking direction (the Z-direction) through the stacked body 100. The stacked film is provided between the stacked body 100 and the semiconductor body 20 and surrounds the semiconductor body 20 from the outer perimeter side. The core film 50 is provided on the inner side of the semiconductor body 20 having the cylindrical configuration.

The upper end portion of the semiconductor body 20 is connected to the bit line BL via the contact Cb and the contact V1 shown in FIG. 1. The lower end portion of the semiconductor body 20 contacts the active region 10a of the substrate 10.

Figure 8:
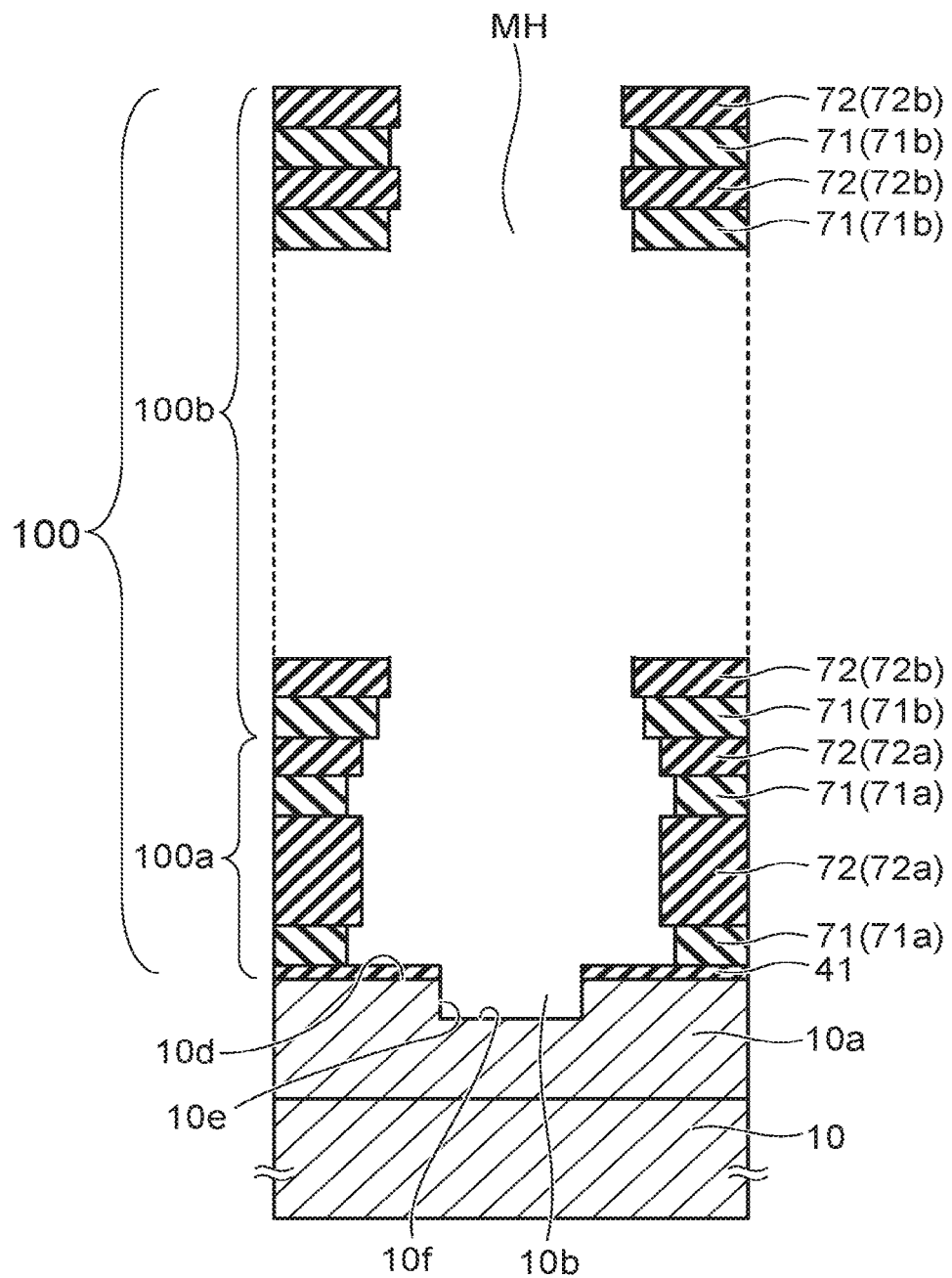

As shown in FIG. 8 described below, the substrate 10 includes a major surface 10d and a recess 10b. The major surface 10d is the front surface of the active region 10a; and the recess 10b is formed in the active region 10a. The planar configuration of the recess 10b is a substantially circular configuration. A side surface 10e of the recess 10b is continuous with the major surface 10d; and a bottom surface 10f of the recess 10b is positioned lower than the major surface 10d.

As shown in FIG. 4, the semiconductor body 20 is in direct contact with the side surface 10e and the bottom surface 10f of the recess 10b of the substrate 10.

The stacked film 30 is provided between the stacked body 100 and the semiconductor body 20 higher than the major surface 10d of the substrate 10 but is not provided in the recess 10b.

The stacked film 30 includes a tunneling insulating film 31, a charge storage film (a charge storage portion) 32, and a blocking insulating film 33. The stacked film 30 extends to be continuous in the stacking direction of the stacked body 100 (the Z-direction).

The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the electrode layers 70.

The semiconductor body 20, the stacked film 30, and the electrode layer 70 are included in a memory cell MC. The memory cell MC has a vertical transistor structure in which the electrode layer 70 surrounds, with the stacked film 30 interposed, the periphery of the semiconductor body 20.

In the memory cell MC that has the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulating body.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes, for example, a silicon oxide film. Or, the blocking insulating film 33 is a stacked film of a silicon oxide film and a metal oxide film.

The stacked body 100 includes a lower layer portion 100a and an upper layer portion 100b. The lower layer portion 100a includes at least the lowermost electrode layer 70 and the lowermost insulating layer 72. The upper layer portion 100b is provided on the lower layer portion 100a. The number of layers of the electrode layers 70 of the upper layer portion 100b is more than the number of layers of the electrode layers 70 of the lower layer portion 100a.

The columnar portion CL includes a bottom portion CLa, a lower portion CLb, and an upper portion CLc. The bottom portion CLa is provided inside the recess 10b of the substrate 10 and does not include the stacked film 30. The lower portion CLb is surrounded with the lower layer portion 100a of the stacked body 100. The upper portion CLc is provided on the lower portion CLb and is surrounded with the upper layer portion 100b of the stacked body 100. The diameter of the lower portion CLb is larger than the diameter of the bottom portion CLa and the diameter of the upper portion CLc.

The material of an insulating layer 72a of the lower layer portion 100a of the stacked body 100 is different from the material of an insulating layer 72b of the upper layer portion 100b. For example, although the insulating layer 72a of the lower layer portion 100a and the insulating layer 72b of the upper layer portion 100b both include silicon oxide as major components, the boron concentration of the insulating layer 72a of the lower layer portion 100a is higher than the boron concentration of the insulating layer 72b of the upper layer portion 100b. For example, the insulating layer 72b of the upper layer portion 100b is a $SiO_2$ layer; and the insulating layer 72a of the lower layer portion 100a is a boron silicate glass (BSG) layer.

The diameter of the portion of the upper portion CLc of the columnar portion CL surrounded with the electrode layer 70 is larger than the diameter of the portion of the upper portion CLc surrounded with the insulating layer 72b. The diameter of the portion of the lower portion CLb of the columnar portion CL surrounded with the electrode layer 70 is larger than the diameter of the portion of the lower portion CLb surrounded with the insulating layer 72a.

As shown in FIG. 1, a drain-side selection transistor STD is provided on the upper end side of the columnar portion CL; and a source-side selection transistor STS is provided on the lower end side of the columnar portion CL.

At least the uppermost electrode layer 70 functions as a control gate of the drain-side selection transistor STD. At least the lowermost electrode layer 70 functions as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the columnar portion CL and are included in one memory string. For example, the memory strings have a staggered arrangement in a planar direction parallel to the XY plane; and the multiple memory cells MC are provided three-dimensionally in the X-direction, the Y-direction, and the Z-direction.

The separation portion 60 will now be described.

As shown in FIG. 3, the separation portion 60 includes an interconnect portion LI and an insulating film 63. The interconnect portion LI includes a semiconductor layer 90 and a metal layer 80 as described below.

The interconnect portion LI spreads in the X-direction and the Z-direction. The insulating film 63 is provided at the side surface of the interconnect portion LI. The insulating film 63 is provided between the stacked body 100 and the interconnect portion LI above the major surface of the substrate 10.

The lower end portion of the interconnect portion LI is in contact with the active region 10a of the substrate 10. The upper end of the interconnect portion LI is connected to the source line SL via a contact Cs shown in FIG. 1.

A current can be caused to flow between the lower end portion of the interconnect portion LI and the lower end portion of the semiconductor body 20 by controlling a potential applied in the lowermost electrode layer 70 to induce an N-channel (an inversion layer) at the front surface of the P-type active region 10a. The lowermost electrode layer 70 functions as a control gate for inducing the channel at the front surface of the active region 10a; and the insulating layer 41 functions as a gate insulating film. In the read operation, the electrons are supplied from the interconnect portion LI to the semiconductor body 20 via the N-channel.

According to the embodiment as shown in FIG. 4, the stacked film 30 which is an insulating film is not provided in the recess 10b of the substrate 10; and the semiconductor body 20 directly contacts the side surface 10e of the recess 10b formed continuously from the major surface 10d. The semiconductor body 20 of the side surface 10e of the recess 10b is linked to the channel (the inversion layer) induced in the front surface of the active region 10a without a high-resistance non-inversion layer being interposed. This improves the cell current flowing through the semiconductor body 20.

The detailed structure of the separation portion 60 will now be described.

Figure 5:
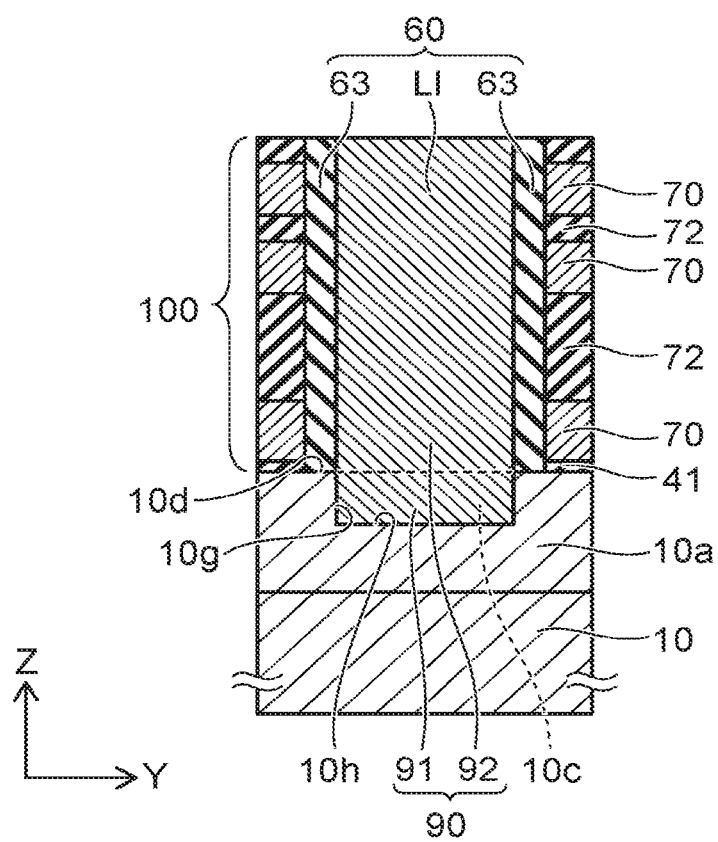
FIG. 5 is a schematic cross-sectional view of the semiconductor device of the embodiment.

FIG. 5 is a schematic enlarged cross-sectional view of the lower portion of the separation portion 60 where the semiconductor layer 90 is provided.

Referring to FIG. 3, the interconnect portion LI includes the metal layer 80 and the semiconductor layer 90 as described above. The semiconductor layer 90 is provided in the lower portion of the interconnect portion LI including a bottom contacting the substrate 10; and the metal layer 80 is provided on the semiconductor layer 90.

The metal layer 80 is, for example, a tungsten layer including tungsten as a major component, or a molybdenum layer including molybdenum as a major component.

Figure 15A:
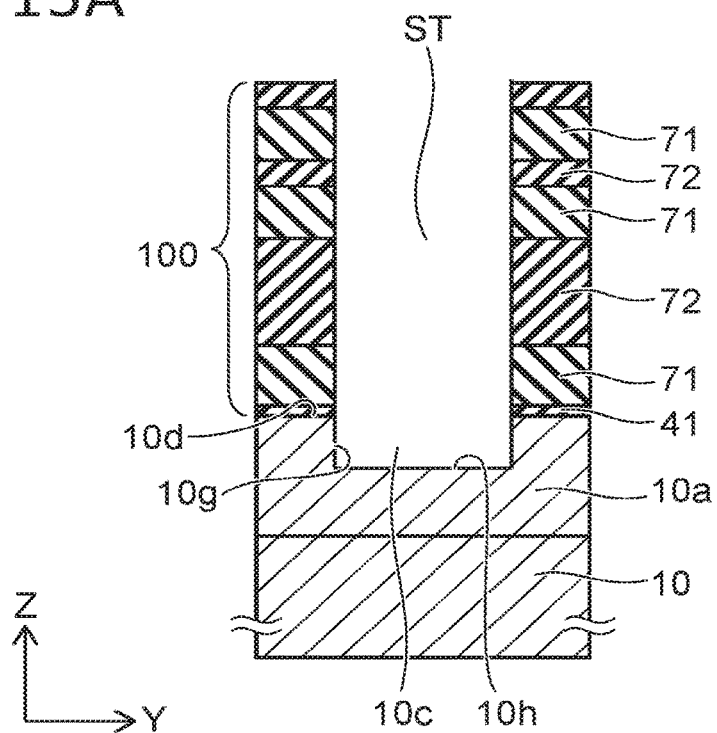

As shown in FIG. 15A described below, a recess 10c is provided in the position of the substrate 10 where the interconnect portion LI is provided. The recess 10c is formed in the active region 10a of the substrate 10 and extends in the X-direction. A side surface 10g of the recess 10c is continuous with the major surface 10d; and a bottom surface 10h of the recess 10c is positioned lower than the major surface 10d.

As shown in FIG. 5, the semiconductor layer 90 includes a lower portion 91 that is provided inside the recess 10c of the substrate 10, and an upper portion 92 that is provided on the lower portion 91. The upper portion 92 is provided higher than the recess 10c.

At least the lower portion 91 of the semiconductor layer 90 is a silicon germanium layer including silicon germanium ($Si_{1-x}Ge_x$, $0<x<1$). The upper portion 92 of the semiconductor layer 90 is a silicon layer or a silicon germanium layer.

The lower portion 91 of the semiconductor layer 90 is in direct contact with the side surface 10g and the bottom surface 10h of the recess 10c.

At least the upper portion 92 of the semiconductor layer includes an N-type impurity; and the N-type impurity concentration of the lower portion 91 inside the recess 10c is lower than the N-type impurity concentration of the upper portion 92. The N-type impurity is, for example, phosphorus (P) or arsenic (As).

The insulating film 63 is provided between the stacked body 100 and the interconnect portion LI above the major surface 10d of the substrate 10. The insulating film 63 is provided at the side surface of the upper portion 92 of the semiconductor layer 90 and the side surface of the metal layer 80 shown in FIG. 3. The insulating film 63 is not provided in the recess 10c of the substrate 10.

For the separation portion 60 including the insulating film 63 and the interconnect portion LI, the width in the Y-direction of the lower portion 91 inside the recess 10c is narrower than the width in the Y-direction of the portion of the separation portion 60 higher than the lower portion 91.

The N-type impurity that is doped into the semiconductor layer 90 is used as a supply source of electrons into the semiconductor body 20 in the read operation. In other words, in the read operation, the electrons are supplied from the semiconductor layer 90 to the semiconductor body 20 via the N-channel induced in the front surface of the active region 10a of the substrate 10.

The N-type impurity concentration of the lower portion 91 of the semiconductor layer 90 provided inside the recess 10c of the substrate 10 is lower than the N-type impurity concentration of the upper portion 92. Therefore, thermal diffusion of the N-type impurity from the lower portion 91 into the P-type active region 10a can be suppressed. This suppresses the threshold fluctuation of the bottom transistor having the electrode layer 70 of the lowermost layer as a control gate and the insulating layer 41 as a gate insulating film.

For example, a tungsten layer or a molybdenum layer is used as the metal layer 80 of the interconnect portion LI. Such a metal layer 80 is in a compressive state after the film formation and applies tensile stress to the substrate (the silicon substrate) 10. The substrate 10 to which the tensile stress is applied warps easily into a concave configuration in the state in which the substrate 10 is on the bottom.

According to the embodiment, a silicon germanium layer that has tensile stress in the reverse direction of the compressive stress of the metal layer 80 after the film formation is provided as the lower portion 91 of the semiconductor layer 90 under the metal layer 80. The silicon germanium layer 91 is filled into the recess 10c of the substrate 10 and applies compressive stress to the substrate 10.

Figure 18:
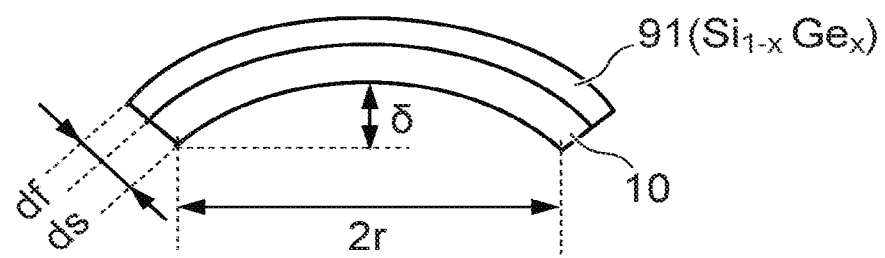
FIG. 18 is a schematic view for explanation of a warpage of a substrate due to a film stress.

As shown in FIG. 18, the substrate 10 to which the compressive stress is applied warps easily in a convex configuration in the state in which the substrate 10 is on the bottom. In other words, the compressive stress that is applied to the substrate 10 by the silicon germanium layer 91 cancels the tensile stress applied to the substrate 10 by the metal layer 80. This suppresses the warp of the substrate 10.

For example, the formation conditions (the size, the coverage, the thickness, the germanium concentration, etc.) of the silicon germanium layer 91 can be adjusted according to the Stoney equation recited below so that a displacement amount δ of the substrate 10 is desirably not more than plus or minus 100 μm.

$$\delta = (\sigma r^2 3(1-v)/Es)(df/ds^2) \times (\text{coverage of the silicon germanium layer 91}).$$

Here, δ is the displacement amount of the substrate 10, σ is the stress of the silicon germanium layer 91, v is the Poisson's ratio of the substrate 10, Es is the Young's modulus of the substrate 10, df is the thickness of the silicon germanium layer 91, and ds is the thickness of the substrate 10.

A method for manufacturing the semiconductor device of the embodiment will now be described with reference to FIG. 6 to FIG. 17B.

Figure 6:
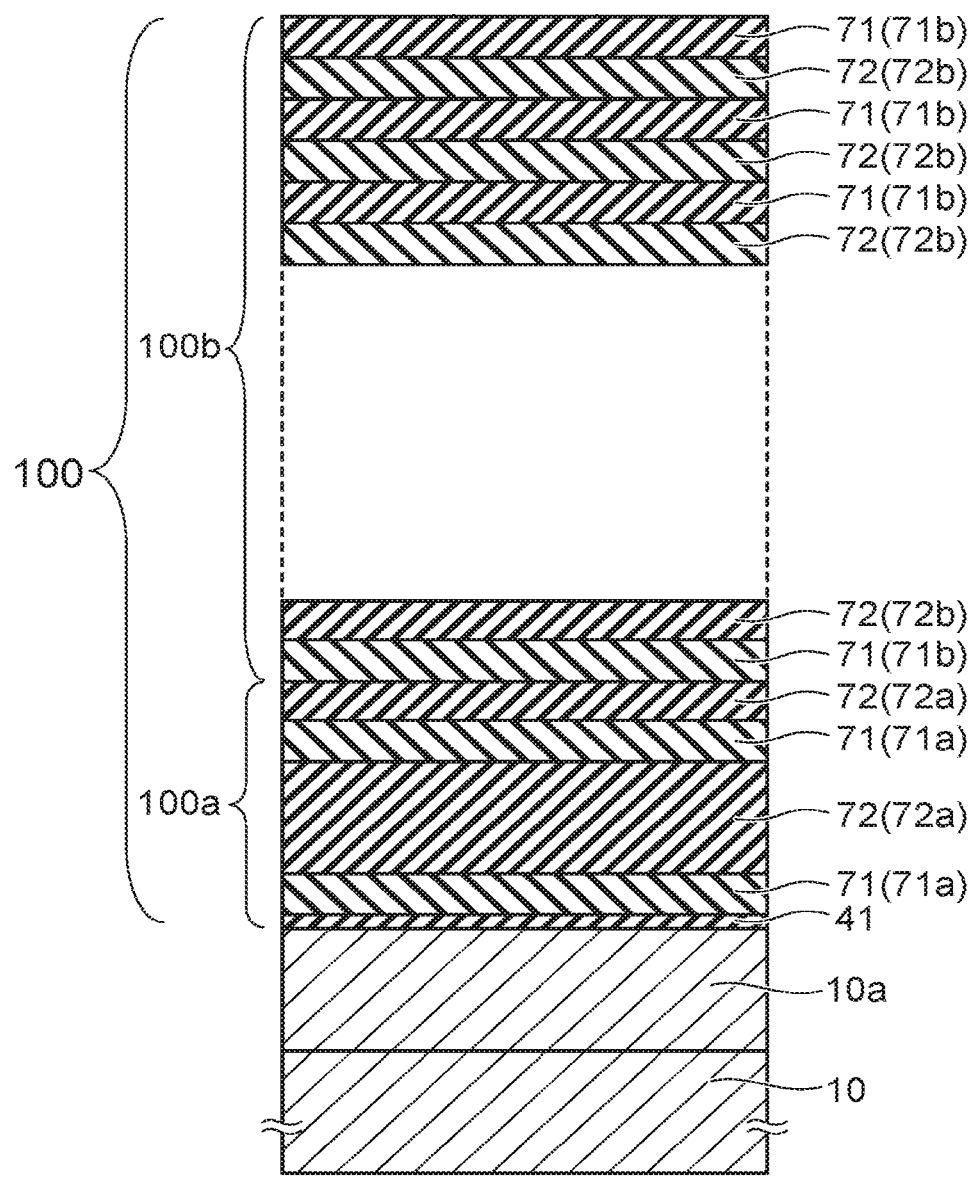
FIG. 6 to FIG. 17B are schematic cross-sectional views showing a method for manufacturing the semiconductor device of the embodiment.

As shown in FIG. 6, the stacked body 100 is formed on the active region 10a of the substrate 10. The insulating layer 41 is formed on the active region 10a; and sacrificial layers 71 as first layers and the insulating layers 72 as second layers are stacked alternately on the insulating layer 41.

Sacrificial layers (first layers) 71a of the lower layer portion 100a of the stacked body 100 are silicon nitride layers (SiN layers); and sacrificial layers (first layers) 71b of the upper layer portion 100b of the stacked body 100 are silicon oxynitride layers (SiON layers). The lower layer portion 100a includes at least the lowermost sacrificial layer 71a and the lowermost insulating layer 72a.

The insulating layers (the second layers) 72a of the lower layer portion 100a of the stacked body 100 are BSG layers; and the insulating layers (the second layers) 72b of the upper layer portion 100b of the stacked body 100 are SiO$_2$ layers.

Figure 7:
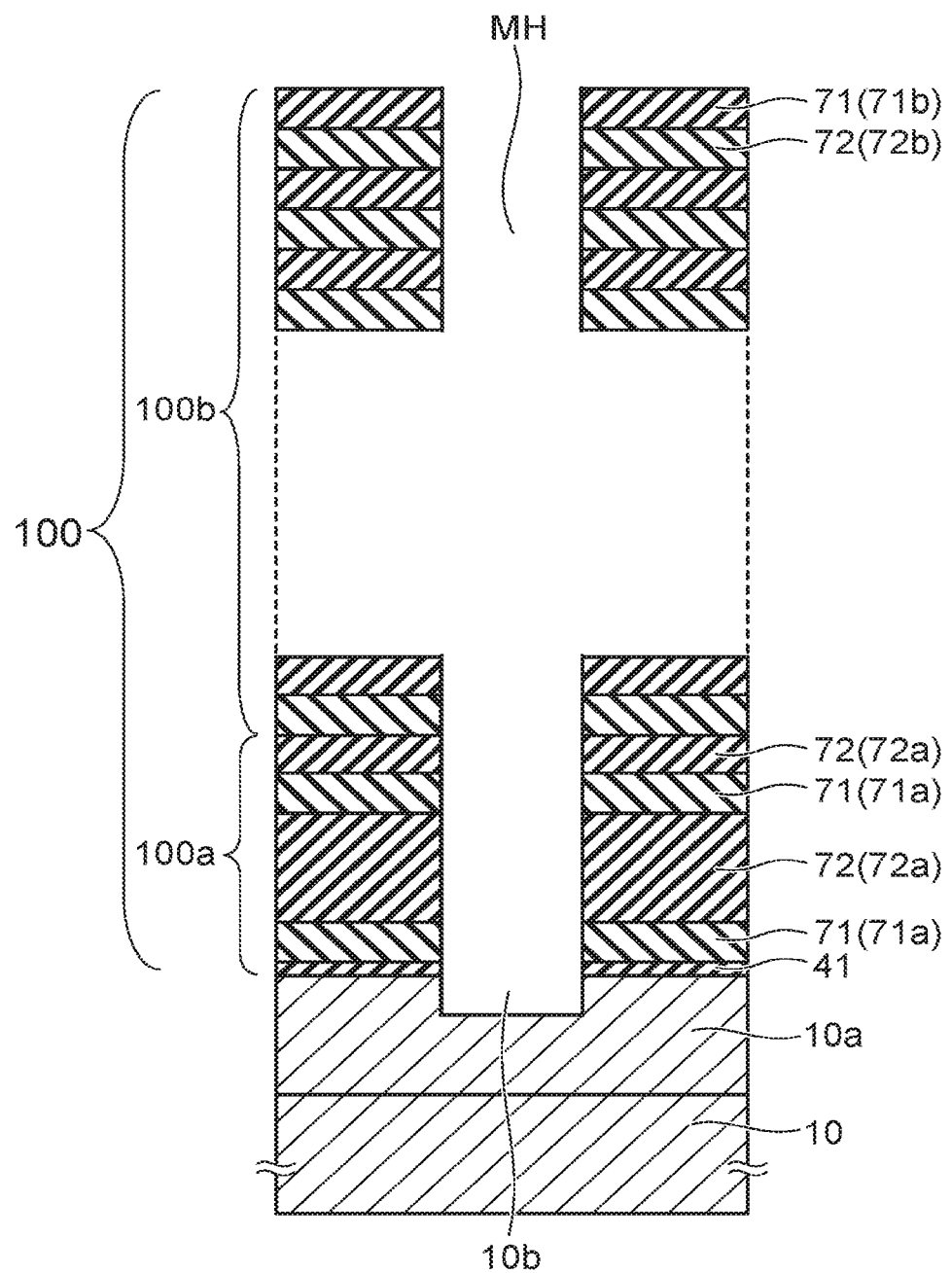

Multiple memory holes MH are formed in the stacked body 100. Only one memory hole MH is illustrated in FIG. 7. The memory holes MH are formed by reactive ion etching (RIE) using a not-illustrated mask layer. The memory holes MH pierce the stacked body 100 and reach the active region 10a of the substrate 10; and the recesses 10b are formed in the substrate 10.

Subsequently, as shown in FIG. 8, the diameter of at least the lower portion of the memory hole MH surrounded with the lower layer portion 100a is widened.

For example, the sacrificial layers (the SiN layers) 71a of the lower layer portion 100a are caused to recede in the diametral direction of the memory hole MH by using an etchant including phosphoric acid. At this time, the sacrificial layers (the SiON layers) 71b of the upper layer portion 100b also are caused to recede in the diametral direction of the memory hole MH. However, the recessed amount of the sacrificial layers (the SiON layers) 71b of the upper layer portion 100b is smaller than the recessed amount of the sacrificial layers (the SiN layers) 71a of the lower layer portion 100a.

Or, the sacrificial layers 71 of the same material may be used in the lower layer portion 100a and the upper layer portion 100b; and the recessed amount of the sacrificial layers 71 may be about the same between the lower layer portion 100a and the upper layer portion 100b.

For example, the insulating layers (the BSG layers) 72a of the lower layer portion 100a are caused to recede in the diametral direction of the memory hole MH by chemical dry etching (CDE) using an etching gas including hydrofluoric acid or vapor phase cleaning (VPC) using a vapor including hydrofluoric acid. At this time, the insulating layers (the SiO$_2$ layers) 72b of the upper layer portion 100b also are caused to recede in the diametral direction of the memory hole MH. However, the recessed amount of the sacrificial layers (the SiO$_2$ layers) 72b of the upper layer portion 100b is smaller than the recessed amount of the sacrificial layers (the BSG layers) 72a of the lower layer portion 100a.

Or, the insulating layers 72 of the same material may be used in the lower layer portion 100a and the upper layer portion 100b; and the recessed amount of the insulating layers 72 may be about the same between the lower layer portion 100a and the upper layer portion 100b.

The recessed amount of the insulating layers (the BSG layers) 72a of the lower layer portion 100a is smaller than the recessed amount of the sacrificial layers (the SiN layers) 71a of the lower layer portion 100a. The side surfaces of the insulating layers (the BSG layers) 72a protrude further toward the central axis side of the memory hole MH than the side surfaces of the sacrificial layers (the SiN layers) 71a.

The recessed amount of the insulating layers (the SiO$_2$ layers) 72b of the upper layer portion 100b is smaller than the recessed amount of the sacrificial layers (the SiON layers) 71b of the upper layer portion 100b. The side surfaces of the insulating layers (the SiO$_2$ layers) 72b protrude further toward the central axis side of the memory hole MH than the side surfaces of the sacrificial layers (the SiON layers) 71b.

The diameter of the recess 10b formed in the substrate 10 does not widen. Accordingly, a level difference is formed between the side surface of the portion of the memory hole MH surrounded with the lower layer portion 100a and a side surface 10e of the recess 10b.

Figure 9:
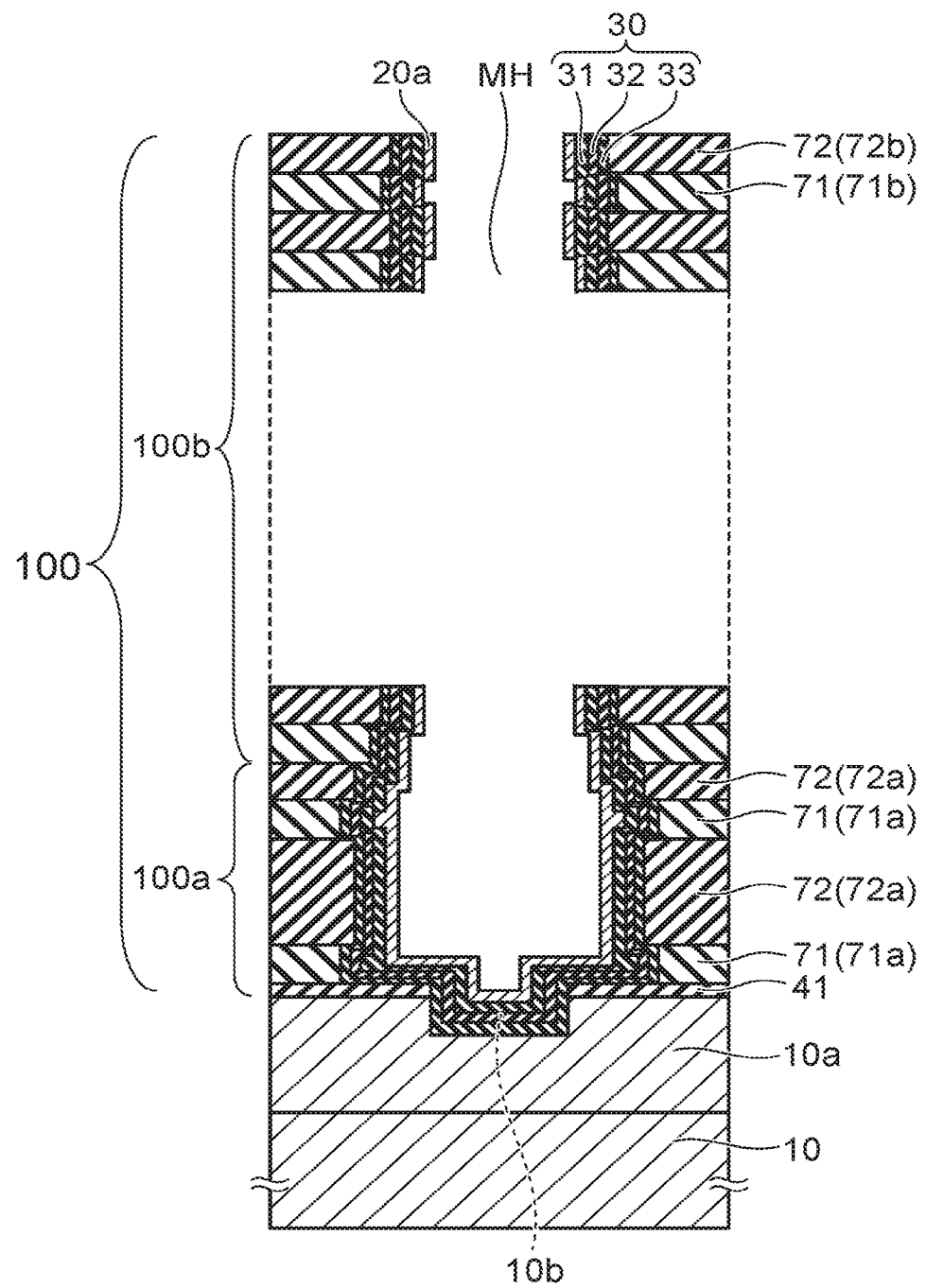

Then, as shown in FIG. 9, the stacked film 30 is formed inside the memory hole MH. The stacked film 30 is formed conformally along the side surface and bottom of the memory hole MH. The stacked film 30 is formed also in the recess 10b of the substrate 10.

Further, a cover film 20a is formed on the inner side of the stacked film 30. The cover film 20a is a silicon film.

Figure 10:
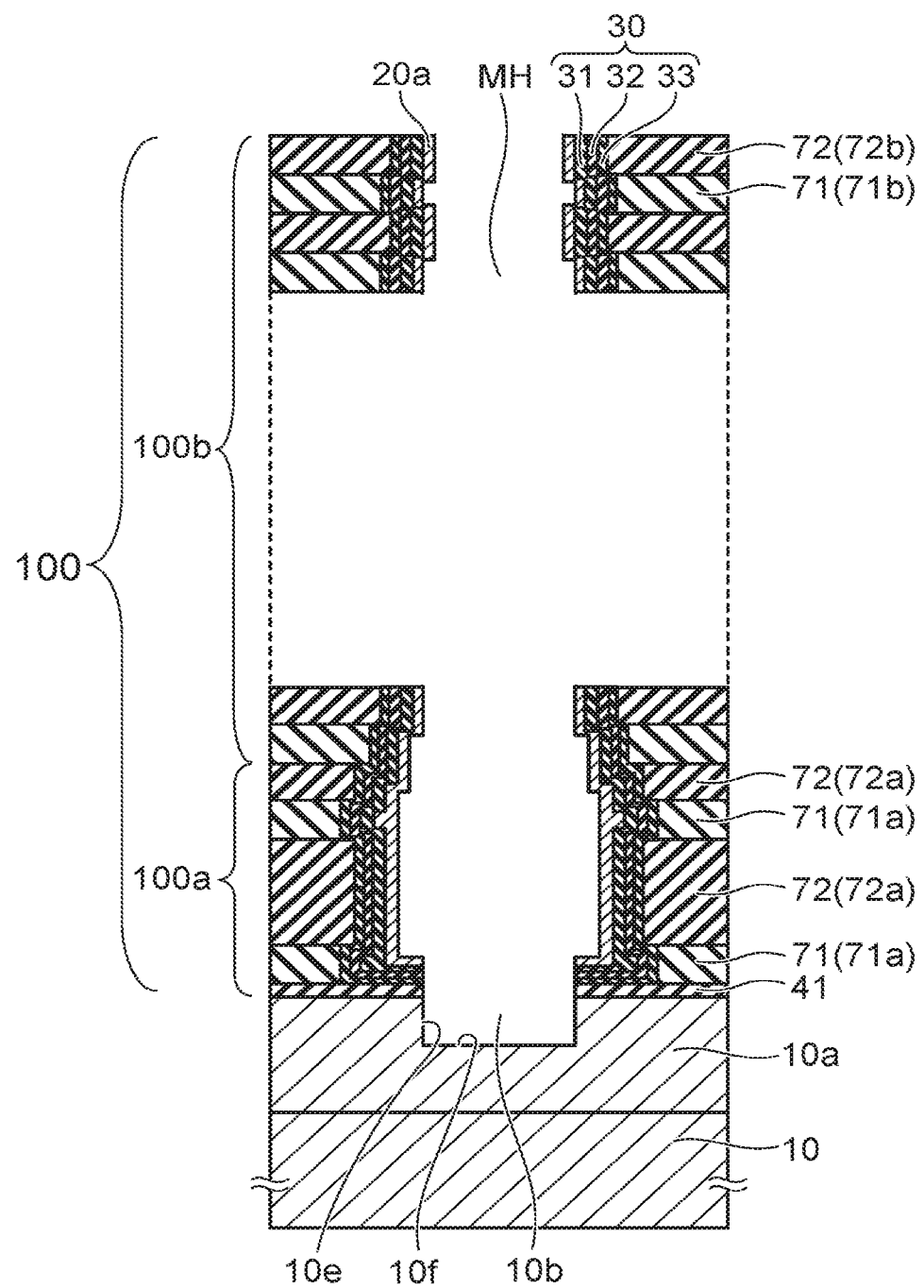

Then, the cover film 20a and the stacked film 30 that are deposited in the recess 10b of the substrate 10 are removed by anisotropic RIE using a not-illustrated mask layer formed on the stacked body 100. As shown in FIG. 10, the recess 10b is exposed at the bottom of the memory hole MH.

Because the diameter of the memory hole MH higher than the recess 10b is larger than the diameter of the recess 10b, the stacked film 30 that is formed on the side surface 10e and a bottom surface 10f of the recess 10b can be removed while causing the cover film 20a and the stacked film 30 to remain on the side surface of the memory hole MH higher than the recess 10b.

Figure 11:
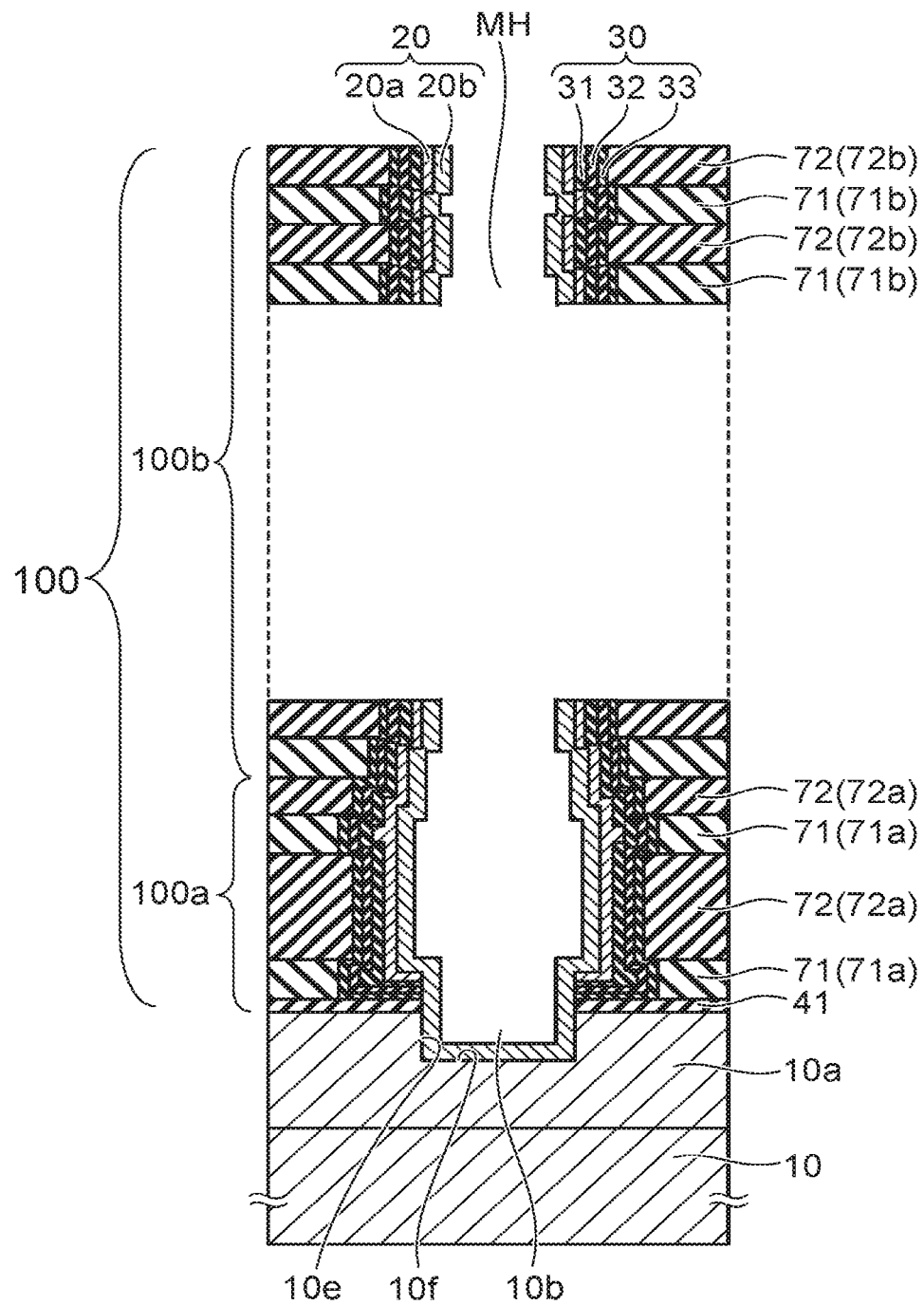

Subsequently, as shown in FIG. 11, a semiconductor film 20b is formed inside the memory hole MH. The semiconductor film 20b is formed on the side surface of the cover film 20a higher than the recess 10b and is formed on the side surface 10e and the bottom surface 10f of the recess 10b. The semiconductor film 20b contacts the active region 10a inside the recess 10b without having the stacked film 30 interposed.

For example, the cover film 20a and the semiconductor film 20b are formed as amorphous silicon films and are crystallized subsequently into polycrystalline silicon films by heat treatment.

Figure 12:
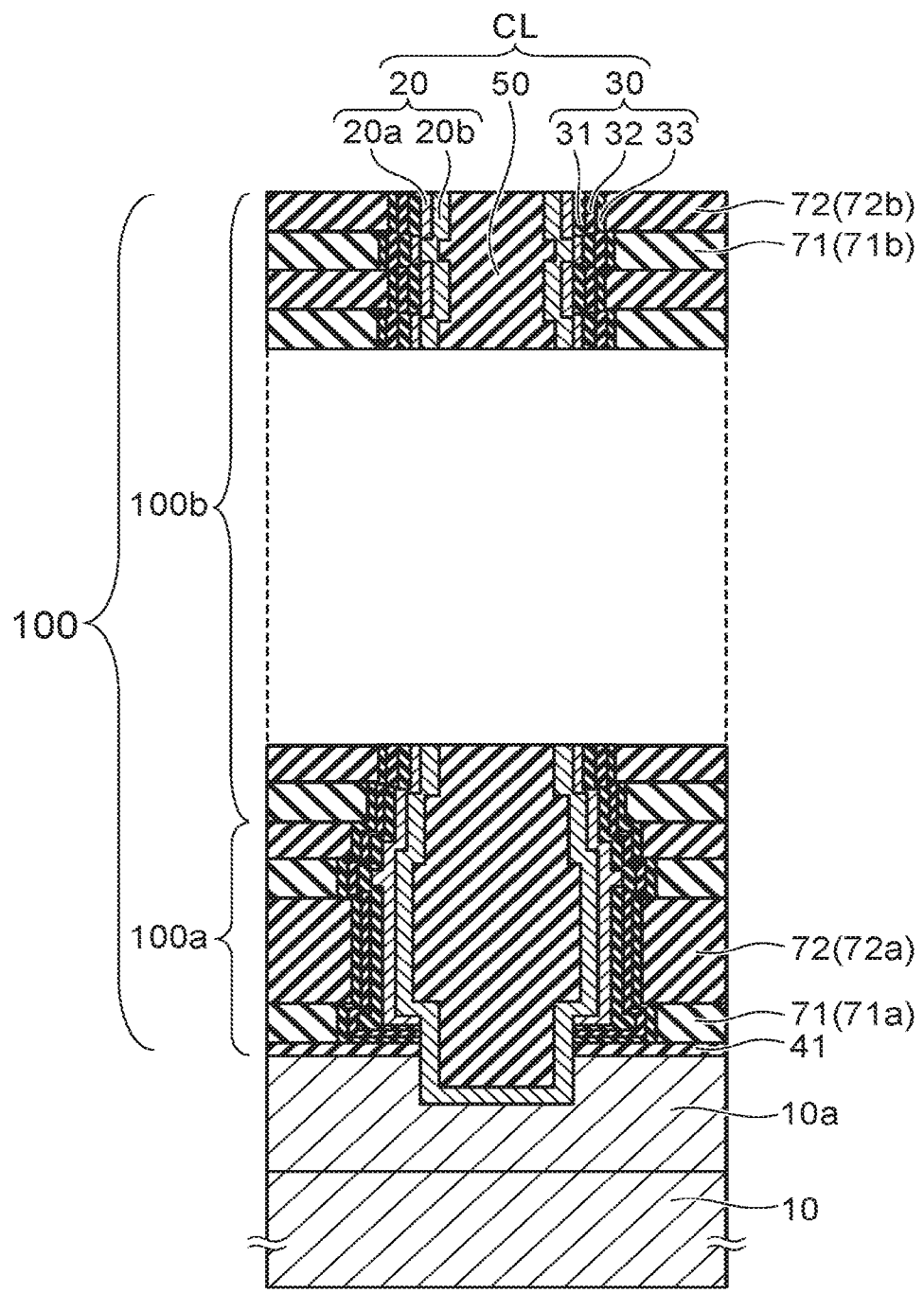

As shown in FIG. 12, the core film 50 is formed on the inner side of the semiconductor film 20b inside the memory hole MH. Thus, the columnar portion CL that includes the stacked film 30, the semiconductor body 20, and the core film 50 is formed inside the stacked body 100.

Subsequently, a slit ST shown in FIG. 15A described below is formed in the stacked body 100. Then, the sacrificial layers (the first layers) 71a and 71b are removed using, for example, an etchant including phosphoric acid supplied via the slit ST.

Figure 13:
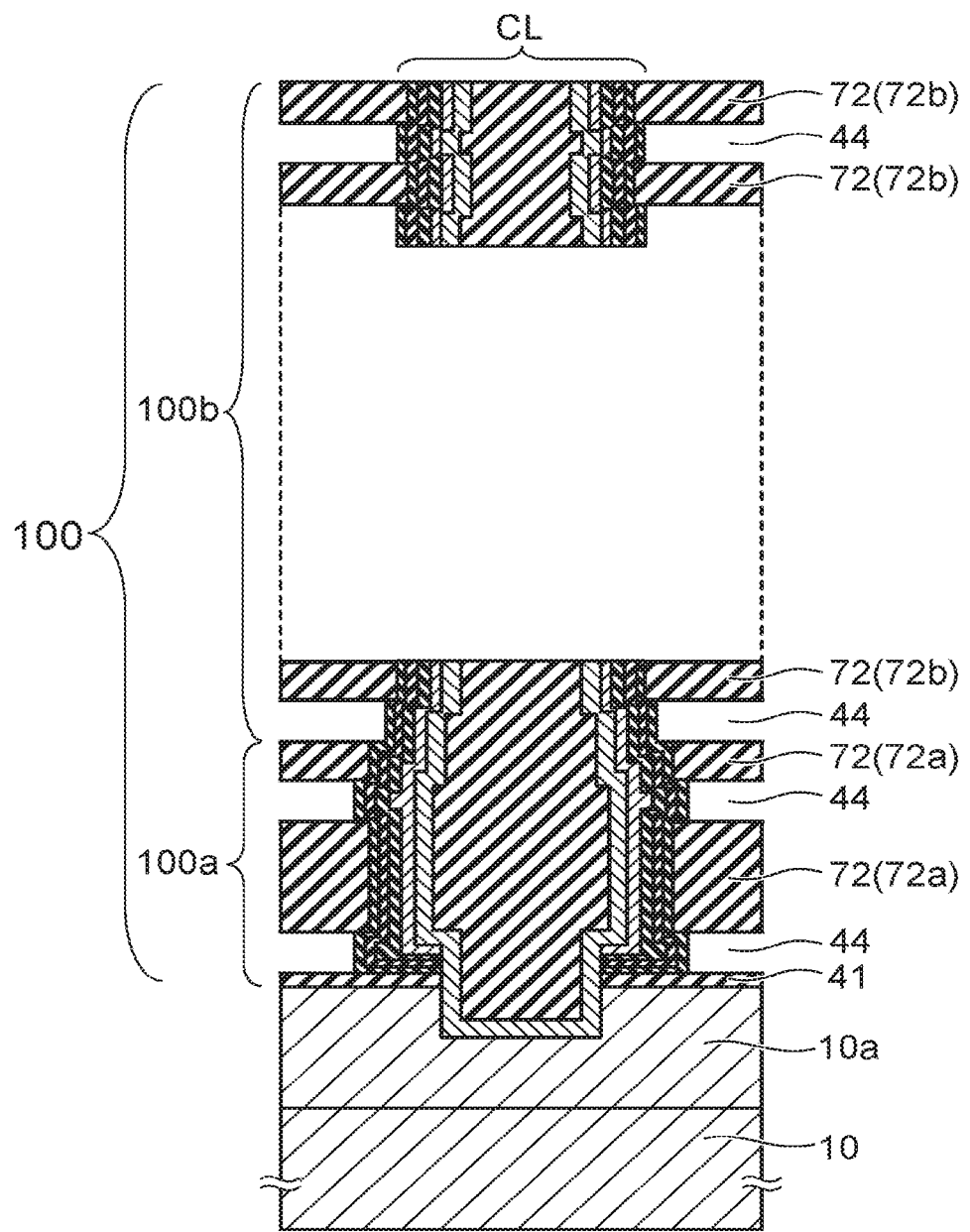

The sacrificial layers 71a and 71b are removed; and as shown in FIG. 13, gaps 44 are formed between the insulating layers (the second layers) 72 adjacent to each other above and below. The gap 44 is formed also between the insulating layer 41 and the insulating layer 72 of the lowermost layer.

The multiple insulating layers 72 contact the side surfaces of the multiple columnar portions CL to surround the side surfaces of the columnar portions CL. The multiple insulating layers 72 are supported by such a physical bond with the multiple columnar portions CL; and the gaps 44 are maintained between the insulating layers 72.

The electrode layers 70 shown in FIG. 4 are formed in the gaps 44 by, for example, CVD. A source gas is supplied to the gaps 44 via the slit ST. The electrode layers 70 that are formed on the side surface of the slit ST are removed.

Also, the electrode layers 70 may be formed after forming a blocking film and a barrier metal on the inner surfaces of the gaps 44.

According to the embodiment, to widen the diameter of the memory hole MH, the sacrificial layers (the first layers) 71a and 71b that are replaced with the electrode layers 70 are caused to recede to be larger than the insulating layers (the second layers) 72a and 72b; and the side surfaces of the insulating layers 72a and 72b protrude further toward the central axis side of the memory hole MH than the sacrificial layers 71a and 71b.

Figure 14:
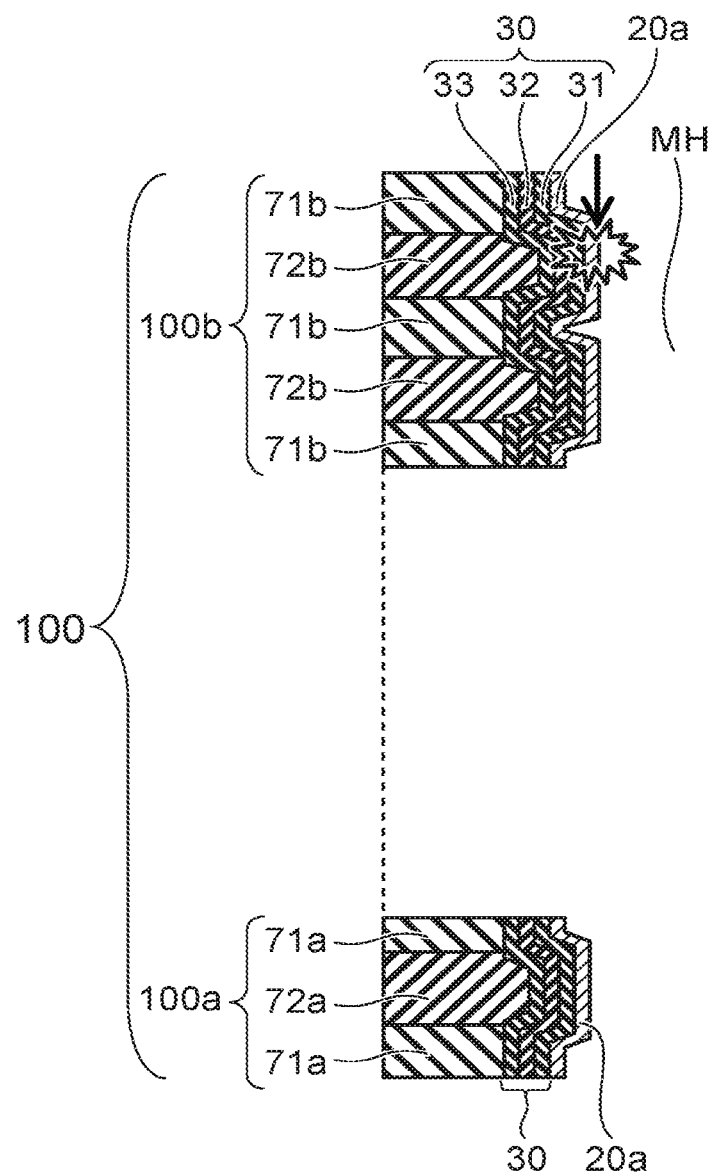

Accordingly, for the stacked film 30 and the cover film 20a formed on the side surface of the memory hole MH, the portions opposing the insulating layers 72a and 72b protrude further toward the central axis side of the memory hole MH than the portions opposing the sacrificial layers 71a and 71b as shown in FIG. 14.

Therefore, when performing the RIE to remove the cover film 20a and the stacked film 30 of the recess 10b, the etching progresses more easily for the stacked film 30 formed on the portions opposing the insulating layers 72a and 72b than for the stacked film 30 formed on the portions opposing the sacrificial layers 71a and 71b. Even if the stacked film 30 formed on the portions opposing the insulating layers 72a and 72b are removed, the semiconductor body 20 and the electrode layers 70 are not shorted.

The slit ST described above is formed to divide, in the Y-direction, the stacked body 100 in the region where the multiple columnar portions CL are arranged. As shown in FIG. 15A, the slit ST pierces the stacked body 100 and reaches the active region 10a of the substrate 10. The recess 10c is formed in the substrate 10 reached by the bottom of the slit ST.

Figure 15B:
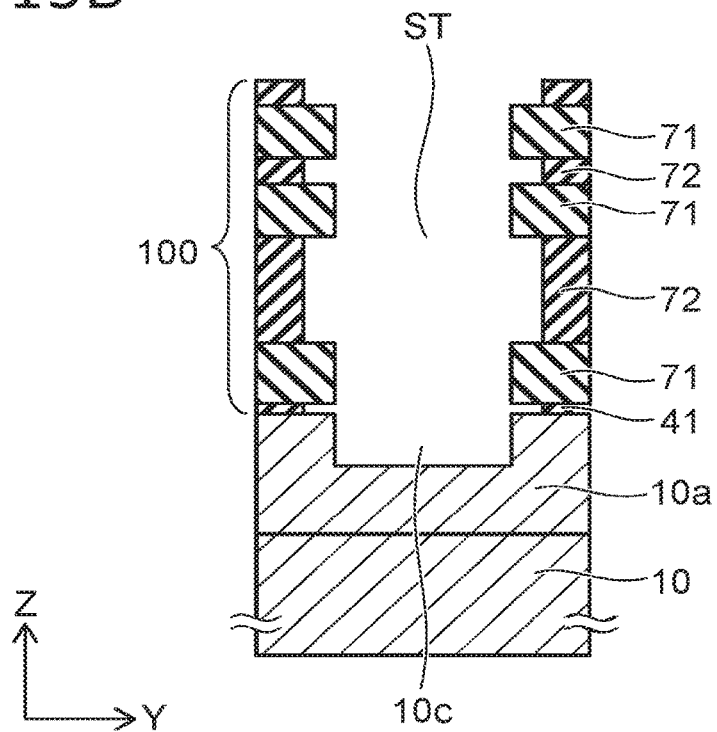

After forming the slit ST, the side surfaces of the insulating layers 72 exposed in the slit ST are caused to recede further than the side surfaces of the sacrificial layers 71 as shown in FIG. 15B. For example, the side surfaces of the insulating layers 72 are caused to recede by supplying an etching gas or a vapor including hydrofluoric acid via the slit ST.

Figure 16A:
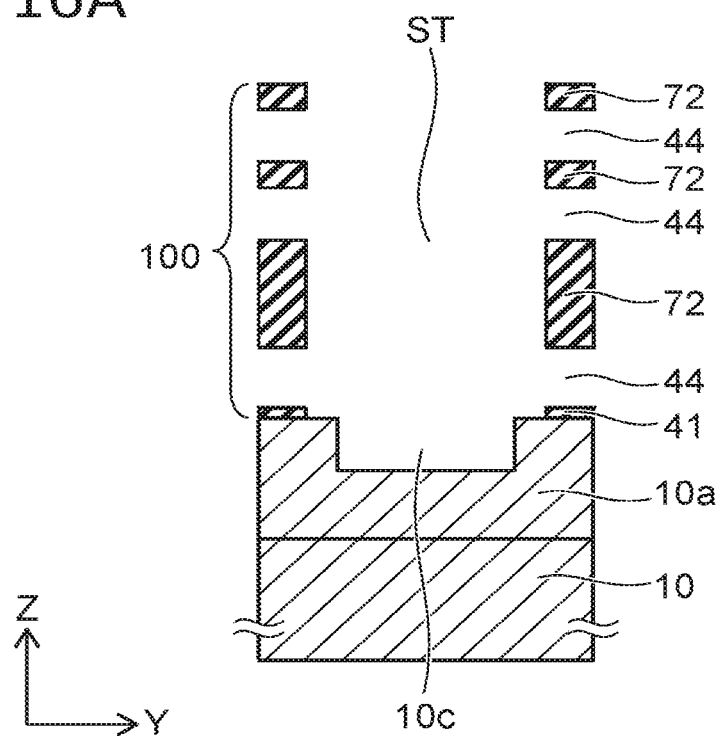
Figure 16B:
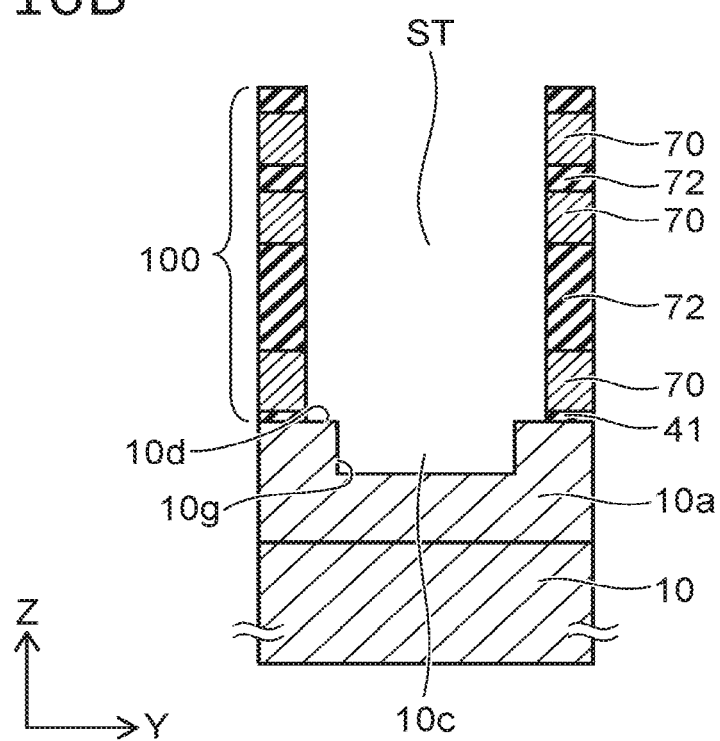

Subsequently, as described above, the sacrificial layers 71 are etched via the slit ST; and the gaps 44 are formed between the insulating layers 72 as shown in FIG. 16A. As shown in FIG. 16B, the electrode layers 70 are formed in the gaps 44. The electrode layer 70 that is formed at the side surface and the bottom (the recess 10c) of the slit ST is removed.

The width in the Y-direction between the side surfaces exposed in the slit ST of the stacked body 100 after the sacrificial layers 71 are replaced with the electrode layers 70 is wider than the width in the Y-direction of the recess 10c formed in the substrate 10. A level difference is formed between the side surface of the stacked body 100 and the side surface 10g of the recess 10c.

Figure 17A:
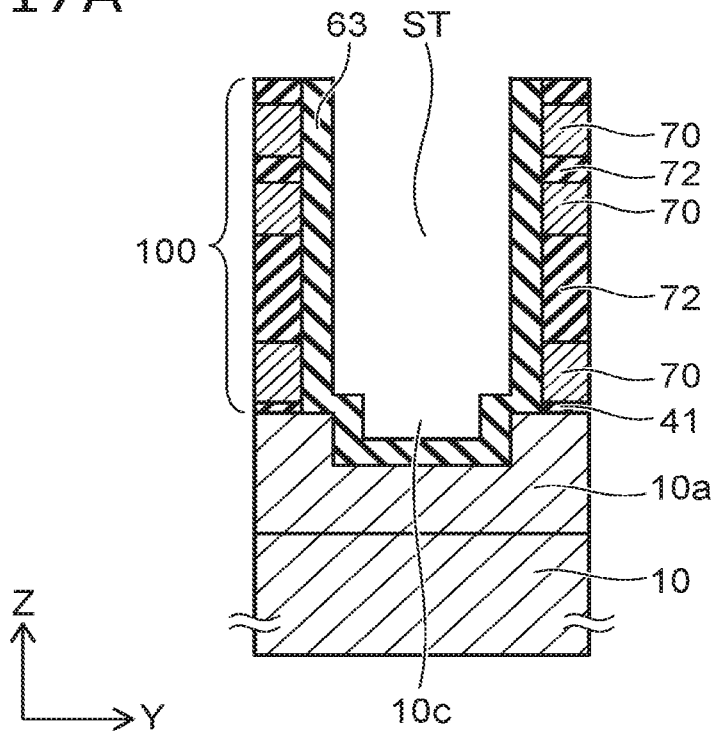
Figure 17B:
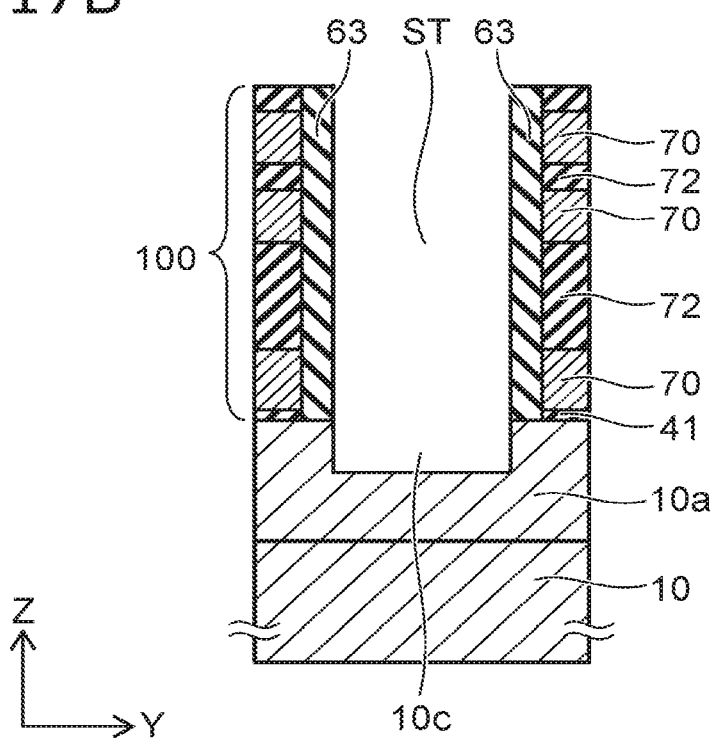

Subsequently, as shown in FIG. 17A, the insulating film 63 is formed at the side surface and the bottom (the recess 10c) of the slit ST. Then, the insulating film 63 that is formed in the recess 10c is removed by anisotropic RIE using a not-illustrated mask layer formed on the stacked body 100. As shown in FIG. 17B, the recess 10c at the bottom of the slit ST is exposed.

Because the width of the slit ST higher than the recess 10c is wider than the width of the recess 10c, the insulating film 63 that is formed in the recess 10c can be removed while causing the insulating film 63 to remain on the side surface of the slit ST higher than the recess 10c.

Subsequently, the semiconductor layer 90 shown in FIG. 5 is formed inside the recess 10c and in the lower portion of the slit ST. For example, the semiconductor layer 90 is formed by epitaxial growth or CVD. At least the semiconductor layer 91 inside the recess 10c is a silicon germanium layer. Also, an N-type impurity is doped into at least the semiconductor layer (the silicon layer or the silicon germanium layer) 92 higher than the recess 10c. The metal layer 80 shown in FIG. 3 is filled into the slit ST on the semiconductor layer 90.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a substrate having a major surface and a recess, the recess having a side surface and a bottom surface, the side surface being continuous with the major surface, the bottom surface being positioned lower than the major surface;
   a stacked body provided above the major surface of the substrate, the stacked body including a plurality of electrode layers stacked with an insulating body interposed; and
   a columnar portion including a semiconductor body and a stacked film, the semiconductor body extending in a stacking direction of the stacked body through the stacked body, the semiconductor body contacting the side surface and the bottom surface of the recess of the substrate, the stacked film including a charge storage portion and being provided between the semiconductor body and the stacked body higher than the major surface of the substrate, the stacked film not being provided in the recess of the substrate,
   the columnar portion including a bottom portion, a lower portion and an upper portion, the bottom portion being provided inside the recess of the substrate, the lower portion being surrounded with a lower layer portion of the stacked body, the lower layer portion including at least a lowermost electrode layer, the upper portion being provided on the lower portion, a diameter of the lower portion being larger than a diameter of the bottom portion and a diameter of the upper portion, the insulating body of the lower layer portion of the stacked body being a first insulating layer, and the insulating body of an upper layer portion of the stacked body being a second insulating layer of a material different from the first insulating layer.

2. The semiconductor device according to claim 1, wherein the first insulating layer and the second insulating layer include silicon oxide as major components, and a boron concentration of the first insulating layer is higher than a boron concentration of the second insulating layer.

3. The semiconductor device according to claim 1, wherein a diameter of a portion of the upper portion of the columnar portion surrounded with the electrode layer is larger than a diameter of a portion of the upper portion of the columnar portion surrounded with the insulating body.

4. The semiconductor device according to claim 1, wherein the substrate includes silicon as a major component, the substrate further has a second recess, the second recess has a side surface continuous with the major surface, the second recess has a bottom surface positioned lower than the major surface, the semiconductor device further comprises a separation portion dividing the stacked body in a first direction at a position of the second recess, and the separation portion includes a semiconductor layer and a metal layer, the semiconductor layer is provided inside at least the second recess, the metal layer is provided on the semiconductor layer, the semiconductor layer inside the second recess includes silicon germanium and contacts the side surface and the bottom surface of the second recess.

5. A semiconductor device, comprising:

a substrate having a major surface and a recess, the recess having a side surface and a bottom surface, the side surface being continuous with the major surface, the bottom surface being positioned lower than the major surface;

a stacked body provided above the major surface of the substrate, the stacked body including a plurality of electrode layers stacked with an insulating body interposed; and a columnar portion including a semiconductor body and a stacked film, the semiconductor body extending in a stacking direction of the stacked body through the stacked body, the semiconductor body contacting the side surface and the bottom surface of the recess of the substrate, the stacked film including a charge storage portion and being provided between the semiconductor body and the stacked body higher than the major surface of the substrate, the stacked film not being provided in the recess of the substrate, the stacked film in direct contact with the semiconductor body continuously extending between the major surface of substrate and an uppermost electrode layer of the electrode layers, wherein the columnar portion includes a bottom portion, a lower portion, and an upper portion, the bottom portion being provided inside the recess of the substrate, the lower portion being surrounded with a lower layer portion of the stacked body, the lower layer portion including at least a lowermost electrode layer, the upper portion being provided on the lower portion, and a diameter of the lower portion is larger than a diameter of the bottom portion and a diameter of the upper portion.

6. The semiconductor device according to claim 5, wherein the insulating body of the lower layer portion of the stacked body is a first insulating layer, and the insulating body of an upper layer portion of the stacked body is a second insulating layer of a material different from the first insulating layer.

7. The semiconductor device according to claim 6, wherein the first insulating layer and the second insulating layer include silicon oxide as major components, and a boron concentration of the first insulating layer is higher than a boron concentration of the second insulating layer.

8. The semiconductor device according to claim 5, wherein a diameter of a portion of the upper portion of the columnar portion surrounded with the electrode layer is larger than a diameter of a portion of the upper portion of the columnar portion surrounded with the insulating body.

9. A semiconductor device, comprising:

a substrate having a major surface and a recess, the recess having a side surface and a bottom surface, the side surface being continuous with the major surface, the bottom surface being positioned lower than the major surface, the substrate including silicon as a major component;

a stacked body provided above the major surface of the substrate, the stacked body including a plurality of electrode layers stacked with an insulating body interposed;

a columnar portion including a semiconductor body and a stacked film, the semiconductor body extending in a stacking direction of the stacked body through the stacked body, the semiconductor body contacting the substrate, the stacked film including a charge storage portion and being provided between the semiconductor body and the stacked body; and a separation portion dividing the stacked body in a first direction at a position of the recess, the separation portion including a semiconductor layer and a metal layer, the semiconductor layer being provided inside at least the recess, the metal layer being provided on the semiconductor layer, the semiconductor layer inside the recess including silicon germanium and contacting the side surface and the bottom surface of the recess, the semiconductor layer including an N-type impurity, and an N-type impurity concentration in the recess being lower than an N-type impurity concentration of a portion higher than the recess.

10. The semiconductor device according to claim 9, wherein a width in the first direction of a portion of the separation portion inside the recess is narrower than a width in the first direction of a portion of the separation portion higher than the portion inside the recess.

11. The semiconductor device according to claim 9, wherein the metal layer includes tungsten or molybdenum as a major component.

12. The semiconductor device according to claim 9, further comprising an insulating film, the insulating film being provided at a side surface of the separation portion above the major surface of the substrate but not being provided in the recess of the substrate.

13. A semiconductor device, comprising:
a substrate having a major surface and a recess, the recess having a side surface and a bottom surface, the side surface being continuous with the major surface, the bottom surface being positioned lower than the major surface, the substrate including silicon as a major component;
a stacked body provided above the major surface of the substrate, the stacked body including a plurality of electrode layers stacked with an insulating body interposed;
a columnar portion including a semiconductor body and a stacked film, the semiconductor body extending in a stacking direction of the stacked body through the stacked body, the semiconductor body contacting the substrate, the stacked film including a charge storage portion and being provided between the semiconductor body and the stacked body; and
a separation portion dividing the stacked body in a first direction at a position of the recess, the separation portion including a semiconductor layer and a metal layer,
the semiconductor layer including only a silicon germanium layer in contact with the side surface and the bottom surface of the recess, and including an N-type impurity, the metal layer in direct contact with the silicon germanium layer, or
the semiconductor layer including a silicon germanium layer in contact with the side surface and the bottom surface of the recess, and a silicon layer provided on the silicon germanium layer, the silicon germanium layer and the silicon layer including an N-type impurity, the metal layer in direct contact with the silicon layer.

14. The semiconductor device according to claim 13, wherein
an N-type impurity concentration in the recess is lower than an N-type impurity concentration of a portion higher than the recess.

15. The semiconductor device according to claim 13, wherein a width in the first direction of a portion of the separation portion inside the recess is narrower than a width in the first direction of a portion of the separation portion higher than the portion inside the recess.

16. The semiconductor device according to claim 13, wherein the metal layer includes tungsten or molybdenum as a major component.

17. The semiconductor device according to claim 13, further comprising an insulating film, the insulating film being provided at a side surface of the separation portion above the major surface of the substrate but not being provided in the recess of the substrate.

* * * * *